US010164598B2

(12) United States Patent
Chai et al.

(10) Patent No.: US 10,164,598 B2
(45) Date of Patent: Dec. 25, 2018

(54) POWER FILTER ARRANGEMENT HAVING A TOROIDAL INDUCTOR PACKAGE

(71) Applicant: Hamilton Sundstrand Corporation, Charlotte, NC (US)

(72) Inventors: Huazhen Chai, Caledonia, IL (US); Eric A. Carter, Monroe, WI (US); John Huss, Roscoe, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 106 days.

(21) Appl. No.: 15/235,635

(22) Filed: Aug. 12, 2016

(65) Prior Publication Data
US 2018/0048278 A1    Feb. 15, 2018

(51) Int. Cl.
H03H 7/06      (2006.01)
H03H 7/01      (2006.01)
H01F 17/06     (2006.01)
H01F 27/40     (2006.01)

(52) U.S. Cl.
CPC .............. H03H 7/06 (2013.01); H01F 17/062 (2013.01); H01F 27/40 (2013.01); H03H 7/0138 (2013.01)

(58) Field of Classification Search
CPC .................................. H03H 7/0138; H03H 7/06

USPC ........................................................ 333/177
See application file for complete search history.

(56) References Cited

U.S. PATENT DOCUMENTS

| 5,065,073 A * | 11/1991 | Frus ...................... F02P 3/0869 |
| | | 123/634 |
| 6,486,570 B1 | 11/2002 | Price et al. |
| 2004/0233015 A1 | 11/2004 | Tsai |
| 2008/0246679 A1 * | 10/2008 | Martek .................. H01Q 1/362 |
| | | 343/793 |

FOREIGN PATENT DOCUMENTS

| EP | 1912329 A2 | 4/2008 |
| WO | 2013044918 A2 | 4/2013 |

OTHER PUBLICATIONS

European Search Report for European Application No. 17184023.4 dated Jan. 19, 2018, 6 pages.

* cited by examiner

Primary Examiner — Benny Lee
Assistant Examiner — Hafizur Rahman
(74) Attorney, Agent, or Firm — Cantor Colburn LLP

(57) ABSTRACT

A power filter arrangement includes a toroidal package having a toroid and a resistive element. The resistive element is disposed about an outer circumference of the toroid and is joined to the toroid. The resistive element is wound about the toroid. The resistive element is provided with a first resistive pattern having an even number of total turns.

11 Claims, 4 Drawing Sheets

POWER FILTER ARRANGEMENT HAVING A TOROIDAL INDUCTOR PACKAGE

BACKGROUND

A basic building block of a power filter is a low pass filter including an inductor (L) and a capacitor (C). The power filter may also contain a damper circuit including a capacitor and a damper resistor (R). The damper resistor may be a thick or thin film resistor. Some damper resistor implementations have a fragile ceramic base and the thick film resistor element limits the pulse power capability of the resistor.

Conventional wire wound resistors are generally large, bulky, and difficult to package. This resistor package style requires a wire harness and supports that increase the production time and cost significantly, and also reduce overall reliability.

BRIEF DESCRIPTION

According to an embodiment of the present disclosure, a power filter arrangement is provided. The power filter arrangement includes a toroidal package having a toroid and a resistive element. The resistive element is disposed about an outer circumference of the toroid and is joined to the toroid. The resistive element is wound about the toroid and has a first resistive pattern.

According to another embodiment of the present disclosure, a toroidal inductor package is provided. The toroidal inductor package includes a toroid having a first resistive element and a second resistive element. The first resistive element defines a first winding that is disposed about an outer circumference of the toroid. The second resistive element defines a second winding that is disposed about the outer circumference of the toroid.

According to yet another embodiment of the present disclosure, a toroidal inductor package is provided. The toroidal inductor package includes a toroidal inductor, a housing, and a resistive element. The housing is disposed about the toroidal inductor. The resistive element is wound about an outer circumference of the housing and is secured to the housing. The resistive element has a resistive pattern with an even number of total turns.

BRIEF DESCRIPTION OF THE DRAWINGS

The subject matter which is regarded as the present disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Referring now to the Figures, where the invention will be described with reference to specific embodiments, without limiting same, it is to be understood that the disclosed embodiments are merely illustrative and may be embodied in various and alternative forms. The Figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
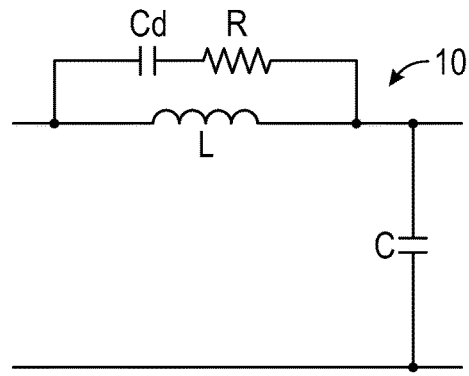
FIG. 1 illustrates a filter circuit having a capacitive damper connected across a filter inductor.

Referring to FIGS. 1-4, illustrative electromagnetic interference (EMI) filters and power filter arrangements are shown. The filter topologies differ from each other in the type of damper circuits and locations of the damper circuits. Referring to FIG. 1 a first damper circuit 10 includes a resistor (R) connected in series with a capacitor ($C_d$). The first damper circuit 10 is connected across the filter inductor (L).

Figure 2:
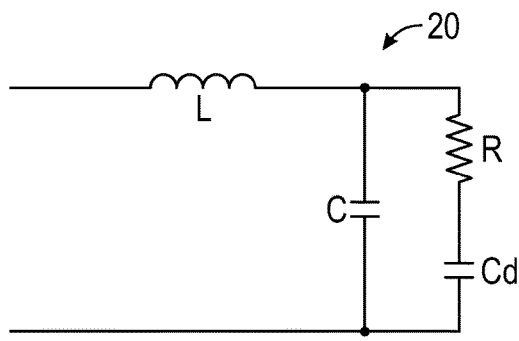
FIG. 2 illustrates a filter circuit having a capacitive damper connected across a filter capacitor.

Referring to FIG. 2, a second damper circuit 20 includes a resistor (R) connected in series with a capacitor ($C_d$). The second damper circuit 20 is connected across the filter capacitor (C).

Figure 3:
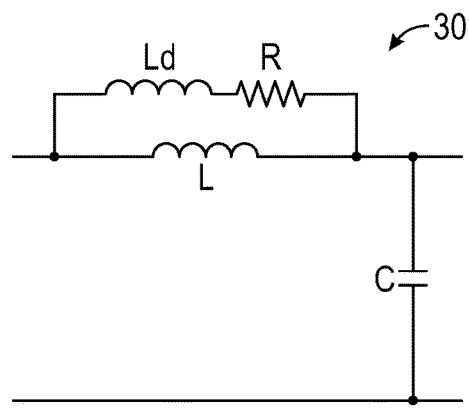
FIG. 3 illustrates another filter circuit having an inductive damper connected across the filter inductor.

Referring to FIG. 3, a third damper circuit 30 includes a resistor (R) connected in series with an inductor ($L_d$). The third damper circuit 30 is an inductive damper that is connected across the filter inductor (L).

Figure 4:
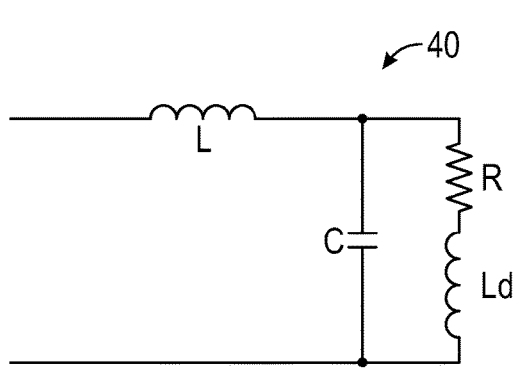
FIG. 4 illustrates a filter circuit having an inductive damper connected across the filter capacitor.

Referring to FIG. 4, a fourth damper circuit 40 includes a resistor (R) connected in series with an inductor ($L_d$). The fourth damper circuit 40 is an inductive damper that is connected across the filter capacitor (C).

Figure 5:
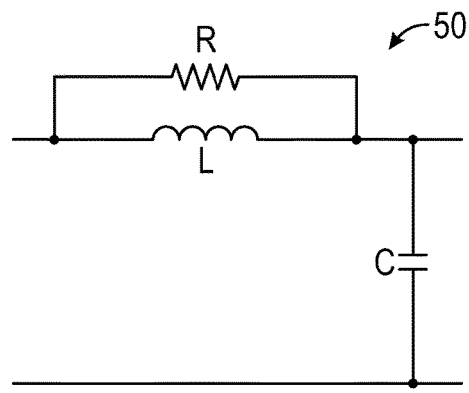
FIG. 5 illustrates a filter circuit having a damper resistor connected across a filter inductor.
Figure 6:
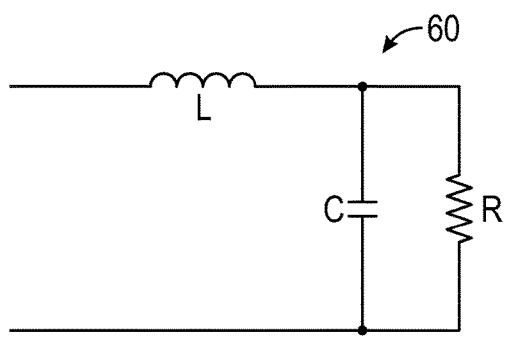
FIG. 6 illustrates a filter circuit having a damper resistor connected across a filter capacitor.

Referring to FIGS. 5 and 6, the capacitor ($C_d$) and/or the inductor (L) may be removed. As shown in FIG. 5, a fifth damper circuit 50 includes a resistor (R) connected across the filter inductor (L). As shown in FIG. 6, a sixth damper circuit 60 includes a resistor (R) connected across the filter capacitor (C).

Figure 7A:
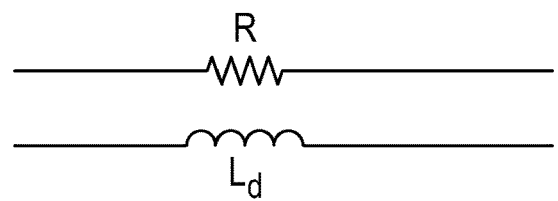
FIG. 7A illustrates a terminal arrangement.
Figure 7B:
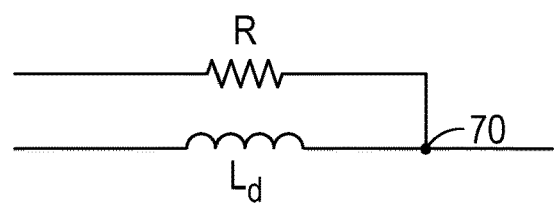
FIG. 7B illustrates another terminal arrangement.

Referring to FIGS. 1-6, one end of the resistor (R) may be connected to a terminal of the inductor (L). Referring to FIG. 7A the resistor (R) ends may be brought out separately. Referring to FIG. 7B, an end 70 of the resistor (R) may be connected to one of the inductor ($L_d$) leads. Therefore the combined resistor (R) and the inductor ($L_d$) may have all four terminals brought out or have three terminals brought out, as depicted in FIGS. 7A and 7B.

The resistor (R) used in each damper circuit may be a thin-film resistor or a thick-film resistor. These resistors may be non-wire-wound resistors that may have a low mass that leads to a low capability to handle pulse power situations. Therefore, the resistor's reliability and life may be compromised due to the in-rush energy incurred during power up and other transient power situations.

Conventional resistors are often made using a ceramic substrate with the resistor element printed on the inside surface of the ceramic. The ceramic substrate may be exposed and may be used in conjunction with a heat sink or heat spreader for thermal management. The ceramic substrate may be fragile and prone to cracking.

Figure 8:
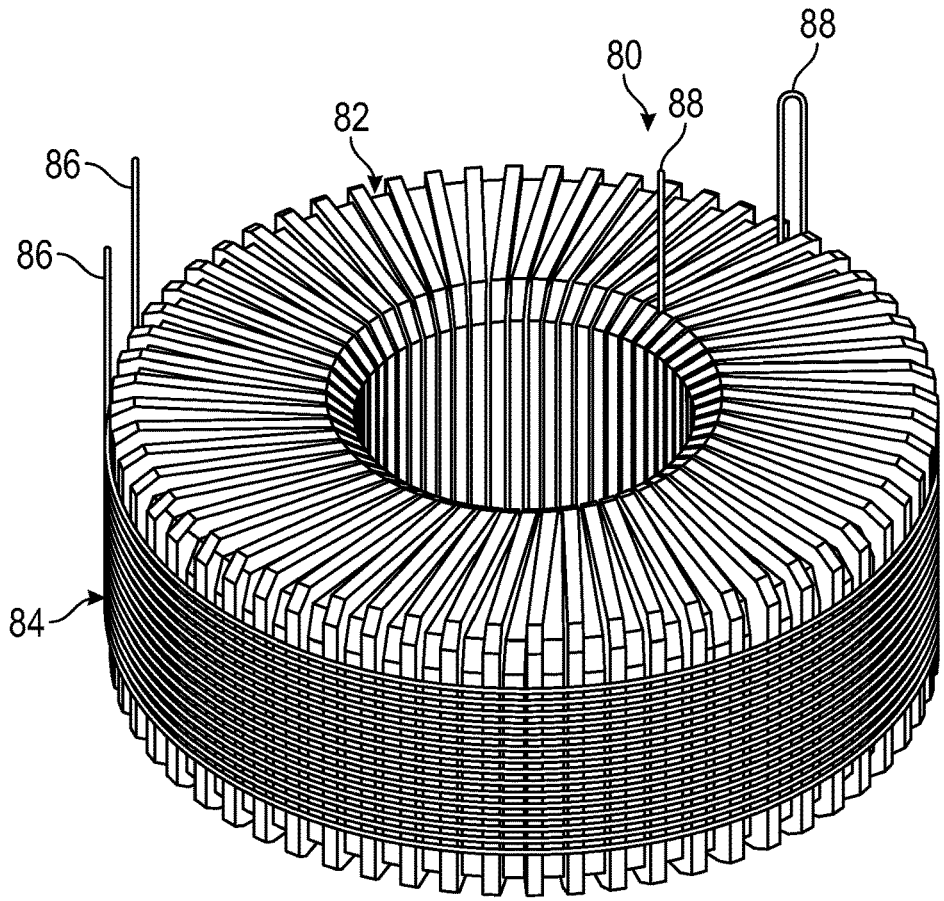
FIG. 8 illustrates a toroidal inductor having a resistive wire wound about the outer circumference of the toroidal inductor.

Referring to FIG. 8, an integrated resistor and inductor 80 is shown. The integrated resistor and inductor 80 may include the inductor that is configured as a toroidal-type inductor having toroid 82 and a resistive element such as a resistive wire 84. The integrated resistor and inductor 80 is configured as a toroidal inductor package. The resistive wire 84 is wound about an outer circumference of the toroid 82. The resistive wire 84 is brought out to a pair of leads 86 that are spaced apart from power leads 88. The resistive wire 84 may be a coated or uncoated resistive alloy wire. An encapsulating material is provided such that the resistive wire 84 is embedded within the encapsulating material and secured to the toroid 82. In at least one embodiment, a resistive pattern may be printed on a flex disk or a suitable circuit-printable substrate and disposed about the outer circumference of the toroid 82.

Figure 9:
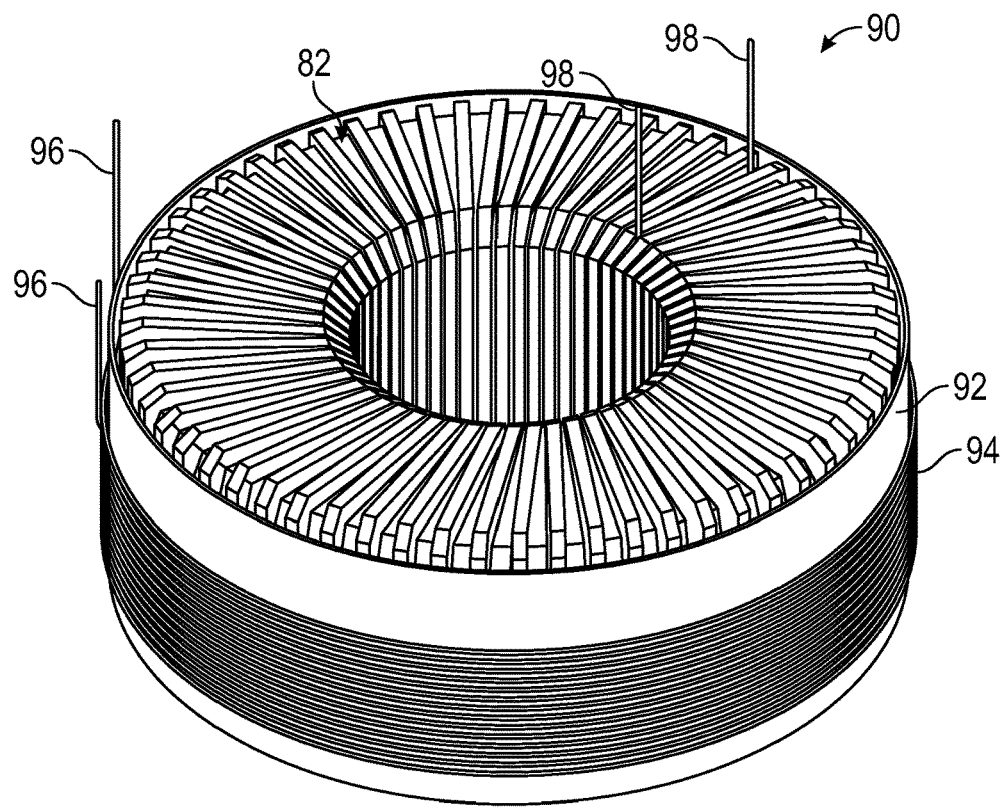
FIG. 9 illustrates a toroidal inductor disposed within an inductor housing having a resistive wire wound about the inductor housing circumference.

Referring to FIG. 9, another integrated resistor and inductor 90 is shown. The integrated resistor and inductor 90 includes the toroid 82 and housing 92. The integrated resistor and inductor 90 is configured as a toroidal inductor package. The toroid 82 is placed into the housing 92. The housing 92 may be a metal housing or other thermally conductive material that is configured to retain and provide thermal management of the toroid 82. A resistive element 94, such as the resistive wire 84, may be wound about an outer circumference of the housing 92. The resistive element 94 is brought out through a pair of leads 96 that are spaced apart from power leads 98. An encapsulating material is provided such that the resistive element 94 is embedded within the encapsulating material and secured to the housing 92. In at least one embodiment, a restive pattern that is printed on a suitable circuit-printable substrate and is disposed about the housing 92.

Figure 10:
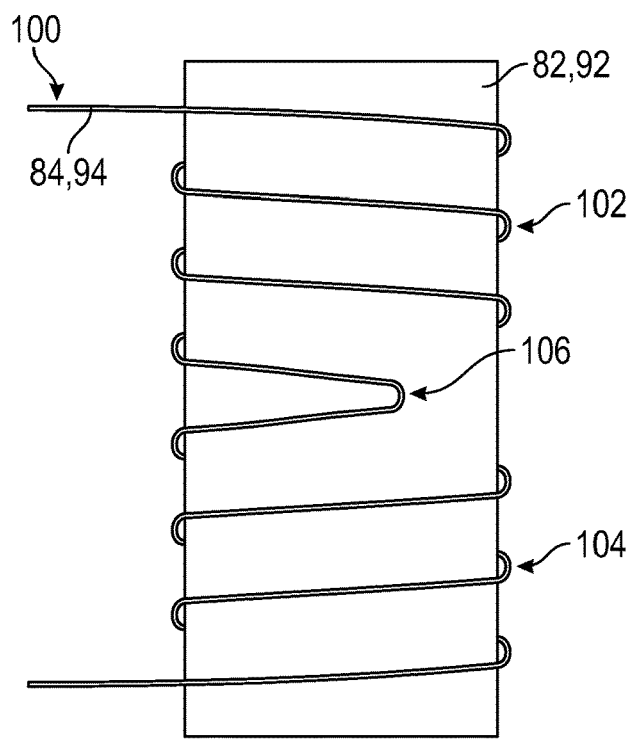
FIG. 10 illustrates a first resistive pattern of a resistive element.

The resistive wire 84 or the resistive element 94 may be wound about the toroid 82 or the housing 92 to provide varying resistive patterns. Referring to FIG. 10, a first resistive pattern 100 of the resistive wire 84 or the resistive element 94 is shown. The first resistive pattern 100 is configured as a resistive winding having an even number of total turns. The resistive winding having an even number of total turns includes a first portion 102 of the total turns are wound about the toroid 82 or the housing 92 in a first direction and a second portion 104 of the total turns are wound about the toroid 82 or the housing 92 in a second direction that is disposed opposite the first direction. The first portion 102 of the total turns is joined to the second portion 104 at a turnaround 106.

The first portion 102 of the total turns and the second portion 104 of the total turns are equal such that there are 0 net turns to cancel or inhibit inductance. In at least one embodiment, the combination of the resistive wire 84 that is wound about the toroid 82 having the first resistive pattern 100 may be completely disposed within the housing 92.

Figure 11:
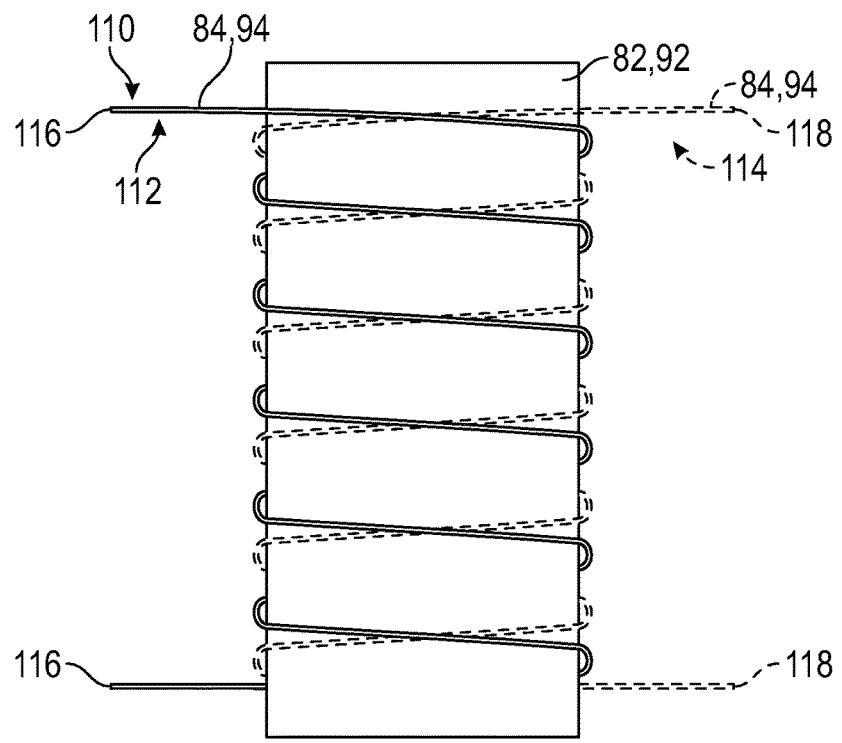
FIG. 11 illustrates a second resistive pattern of a resistive element.

Referring to FIG. 11, a second resistive pattern 110 of the resistive wire 84 or the resistive element 94 is shown. The second resistive pattern 110 includes a first resistive wire or element configured as a first winding 112 and a second resistive wire or element configured as a second winding 114 that are each wound about the toroid 82 or the housing 92. The first winding 112 is wound about the toroid 82 or the housing 92 in a first direction having a first plurality of turns. The second winding 114 is wound about the toroid 82 or the housing in a second direction having a second plurality of turns. The second direction is disposed opposite the first direction. A number of the first plurality of turns is equal to a number of the second plurality of turns such that there are 0 net turns to cancel or inhibit inductance.

The first winding 112 and the second winding 114 are wound about the toroid 82 or the housing 92 such that the windings are paralleled windings that intersect at one intersection point at respective turns. Leads 116 associated with the first winding 112 are disposed exactly opposite leads 118 associated with the second winding 114.

Figure 12:
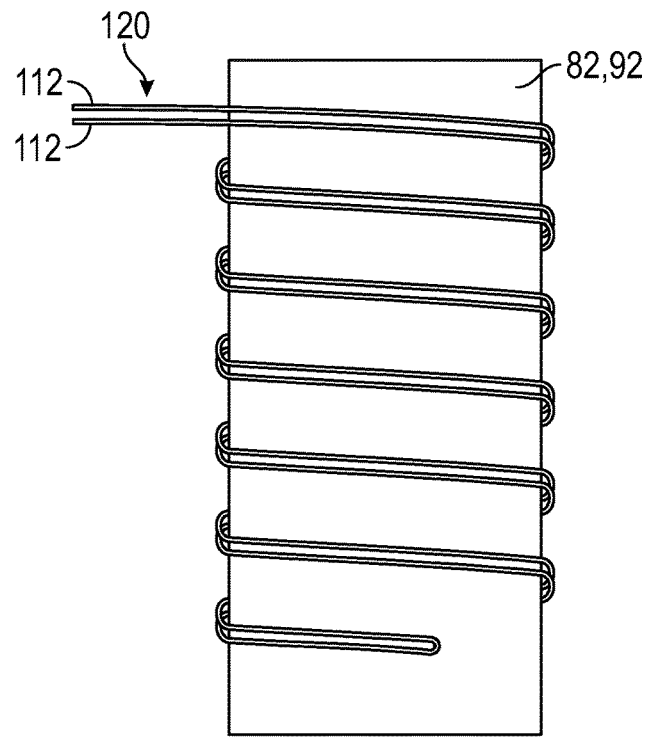
FIG. 12 illustrates a third resistive pattern of a resistive element.

Referring to FIG. 12, a third resistive pattern 120 of the resistive wire 84 or the resistive element 94 is shown. The third resistive pattern 120 winds bifilar wires 122 about the toroid 82 or the housing 92.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the scope of the present disclosure. Additionally, while various embodiments of the present disclosure have been described, it is to be understood that aspects of the present disclosure may include only some of the described embodiments or combinations of the described embodiments. Accordingly, the present disclosure is not to be seen as limited by the foregoing description, but is only limited by the scope of the appended claims.

The invention claimed is:

1. A power filter arrangement, comprising:
   a toroid; and
   a resistive element disposed about an outer circumference of the toroid and joined to the toroid, the resistive element being wound about the toroid and having a first resistive pattern configured as a resistive winding having an even number of total turns, the resistive winding includes a first portion of the even number of total turns are wound about the toroid in a first direction and a second portion of the even number of total turns are wound about the toroid in a second direction.

2. The power filter arrangement of claim 1, wherein the first direction is disposed opposite the second direction.

3. The power filter arrangement of claim 2, wherein a combination of the toroid and the resistive element are disposed within a housing.

4. The power filter arrangement of claim 3, wherein the resistive element is disposed between the toroid and the housing.

5. A toroidal inductor package, comprising:
   a toroid having a first resistive element defining a first winding disposed about an outer circumference of the toroid and a second resistive element defining a second winding disposed about the outer circumference of the toroid,
   the first winding is wound about the toroid in a first direction and the second winding is wound about the toroid in a second direction,
   the first winding has a first plurality of turns and the second winding has a second plurality of turns, and
   a number of the first plurality of turns is equal to a number of the second plurality of turns.

6. The toroidal inductor package of claim 5, wherein the first direction is disposed opposite the second direction.

7. A toroidal inductor package, comprising:
a toroidal inductor;
a housing disposed about the toroidal inductor; and
a resistive element being wound about an outer circumference of the housing and secured to the housing, the resistive element having a resistive pattern having an even number of total turns, the resistive pattern being configured as at least one of a resistive winding and first resistive element, the resistive winding have a first portion of the even number of total turns being wound about the housing in a first direction and a second portion of the even number of total turns being wound about the housing in a second direction.

8. The toroidal inductor package of claim 7, wherein the first direction is disposed opposite the second direction.

9. The toroidal inductor package of claim 7, wherein the first resistive element defines a first winding and a second resistive element defining a second winding.

10. The toroidal inductor package of claim 9, wherein the first winding is wound about the housing in a first direction and the second winding is wound about the housing in a second direction.

11. The toroidal inductor package of claim 10, wherein the first direction is disposed opposite the second direction.

* * * * *